US008859414B2

(12) United States Patent
West

(10) Patent No.: US 8,859,414 B2
(45) Date of Patent: Oct. 14, 2014

(54) ELECTRONIC ASSEMBLIES INCLUDING MECHANICALLY SECURED PROTRUDING BONDING CONDUCTOR JOINTS

(75) Inventor: Jeffrey A. West, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 458 days.

(21) Appl. No.: 13/397,844

(22) Filed: Feb. 16, 2012

(65) Prior Publication Data
US 2012/0149155 A1 Jun. 14, 2012

Related U.S. Application Data

(62) Division of application No. 12/572,615, filed on Oct. 2, 2009, now Pat. No. 8,143,704.

(51) Int. Cl.
H01L 21/44 (2006.01)
H01L 23/00 (2006.01)
H01L 23/48 (2006.01)
H01L 23/498 (2006.01)

(52) U.S. Cl.
CPC ............... *H01L 24/13* (2013.01); *H01L 24/29* (2013.01); *H01L 24/16* (2013.01); *H01L 2224/29101* (2013.01); *H01L 2224/29298*
(Continued)

(58) Field of Classification Search
None
See application file for complete search history.

(56) References Cited

U.S. PATENT DOCUMENTS

| 5,457,879 | A  | * | 10/1995 | Gurtler et al. | 438/108 |
| 6,303,991 | B1 | * | 10/2001 | Harper et al.  | 257/734 |
| 6,518,518 | B1 | * | 2/2003  | Saiki et al.   | 174/267 |
| 6,555,415 | B2 | * | 4/2003  | Hedler         | 438/108 |

(Continued)

*Primary Examiner* — David E Graybill
(74) *Attorney, Agent, or Firm* — Steven A. Shaw; Frederick J. Telecky, Jr.

(57) ABSTRACT

A method for joining integrated circuit (IC) die. The includes pressing the IC die toward a workpiece so that a protruding bonding feature is inserted into a cavity of a receptacle through an opening. The pressing bends peripheral shelf regions downward into the cavity and towards sidewall portions of the receptacle to form bent peripheral shelf regions. A protruding bonding feature contacts the bent peripheral shelf regions along a contact area. The contact area being at least primarily along the sidewall surfaces of the protruding bonding feature.

15 Claims, 15 Drawing Sheets

(52) U.S. Cl.
CPC ......... (2013.01); *H01L 2224/81898* (2013.01); *H01L 2224/83194* (2013.01); *H01L 2924/19041* (2013.01); *H01L 2224/13099* (2013.01); *H01L 2924/01006* (2013.01); H01L 23/481 (2013.01); H01L 23/49838 (2013.01); *H01L 2224/13147* (2013.01); H01L 24/14 (2013.01); *H01L 2224/0603* (2013.01); *H01L 2224/29* (2013.01); *H01L 2924/0132* (2013.01); *H01L 2224/73103* (2013.01); *H01L 2924/01327* (2013.01); *H01L 2924/01025* (2013.01); *H01L 2224/0401* (2013.01); *H01L 2224/13011* (2013.01); *H01L 2224/2919* (2013.01); *H01L 2224/29111* (2013.01); *H01L 2924/01022* (2013.01); *H01L 2224/81201* (2013.01); *H01L 2924/01079* (2013.01); *H01L 2924/01029* (2013.01); *H01L 2224/81136* (2013.01); *H01L 2224/16* (2013.01); *H01L 2224/13611* (2013.01); *H01L 2224/131* (2013.01); *H01L 2224/1403* (2013.01); *H01L 2924/01073* (2013.01); *H01L 2924/01074* (2013.01); *H01L 2924/01033* (2013.01); H01L 23/49811 (2013.01); *H01L 2924/01005* (2013.01); *H01L 2224/81894* (2013.01); *H01L 2924/0105* (2013.01); *H01L 2924/01077* (2013.01); *H01L 2224/812* (2013.01); *H01L 2924/014* (2013.01); *H01L 2924/00013* (2013.01); *H01L 2224/81801* (2013.01); *H01L 2924/01044* (2013.01); H01L 24/81 (2013.01); *H01L 2924/01046* (2013.01); *H01L 2924/01082* (2013.01)
USPC .......................................... 438/614; 438/666

(56) References Cited

U.S. PATENT DOCUMENTS

| | | | | |
|---|---|---|---|---|
| 7,118,389 | B2 * | 10/2006 | Fork et al. | 439/74 |
| 7,129,725 | B2 * | 10/2006 | Akram et al. | 324/754.2 |
| 7,291,791 | B2 * | 11/2007 | Saiki et al. | 174/267 |
| 7,872,332 | B2 * | 1/2011 | Fay et al. | 257/621 |
| 8,143,704 | B2 * | 3/2012 | West | 257/621 |
| 8,227,295 | B2 * | 7/2012 | Simmons-Matthews et al. | 438/109 |
| 8,227,839 | B2 * | 7/2012 | West | 257/276 |
| 8,293,577 | B2 * | 10/2012 | Awano et al. | 438/108 |
| 8,304,893 | B2 * | 11/2012 | West | 257/698 |
| 8,435,836 | B2 * | 5/2013 | Fay et al. | 438/109 |
| 8,691,692 | B2 * | 4/2014 | Lim et al. | 438/667 |
| 2002/0094707 | A1 * | 7/2002 | Hedler | 439/74 |
| 2003/0089524 | A1 * | 5/2003 | Saiki et al. | 174/267 |
| 2005/0186812 | A1 * | 8/2005 | Saiki et al. | 439/78 |
| 2005/0282411 | A1 * | 12/2005 | Fork et al. | 439/74 |
| 2006/0181294 | A1 * | 8/2006 | Akram et al. | 324/754 |
| 2008/0001270 | A1 * | 1/2008 | Ogata et al. | 257/678 |
| 2008/0169563 | A1 * | 7/2008 | Awano et al. | 257/746 |
| 2010/0059897 | A1 * | 3/2010 | Fay et al. | 257/777 |
| 2011/0021016 | A1 * | 1/2011 | Awano et al. | 438/610 |
| 2011/0049717 | A1 * | 3/2011 | West | 257/751 |
| 2011/0079916 | A1 * | 4/2011 | West | 257/774 |
| 2011/0111561 | A1 * | 5/2011 | Fay et al. | 438/109 |
| 2011/0187000 | A1 * | 8/2011 | West | 257/751 |
| 2011/0227227 | A1 * | 9/2011 | West | 257/757 |
| 2012/0127681 | A1 * | 5/2012 | Ryu et al. | 361/772 |
| 2012/0149155 | A1 * | 6/2012 | West | 438/118 |

* cited by examiner

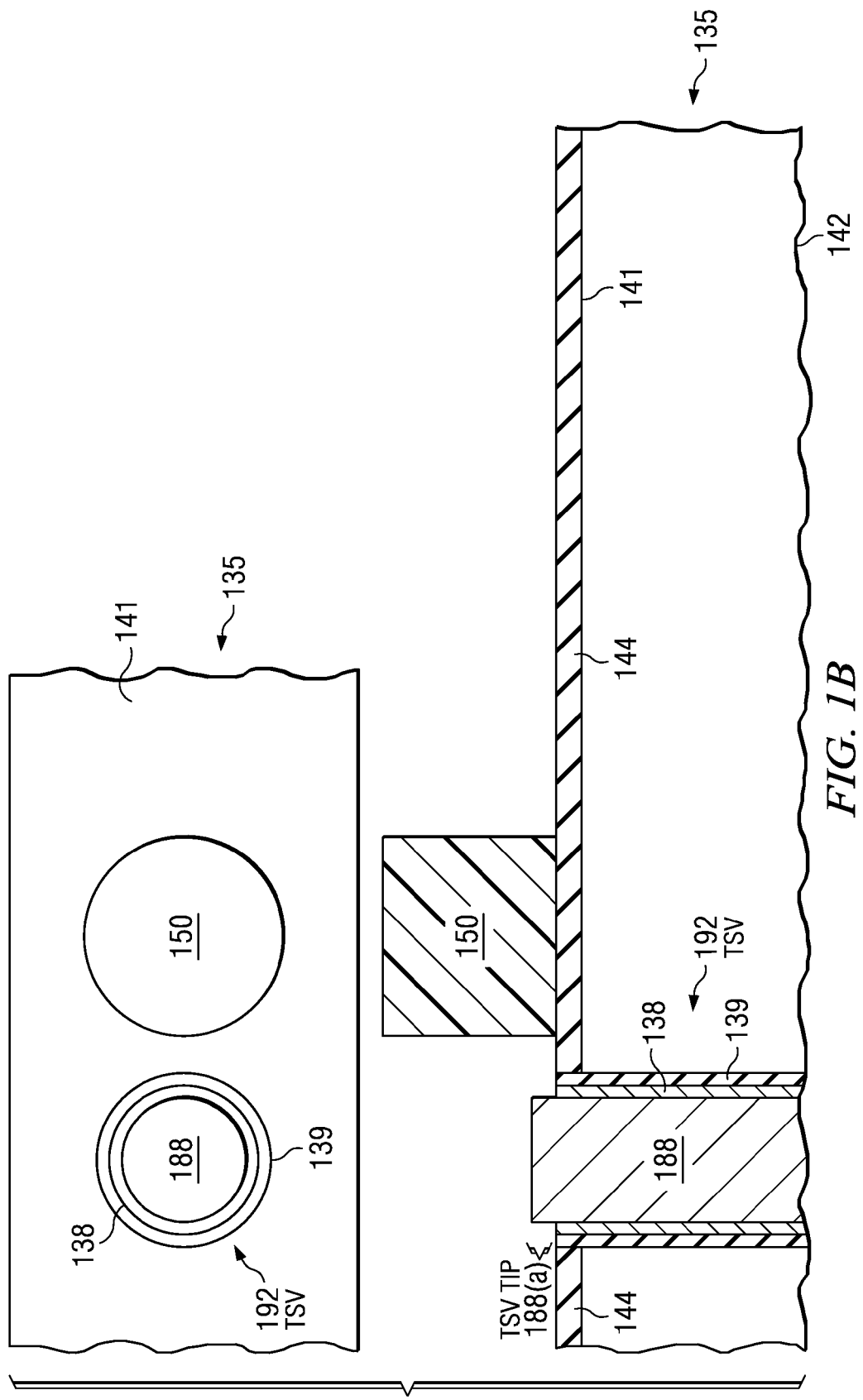

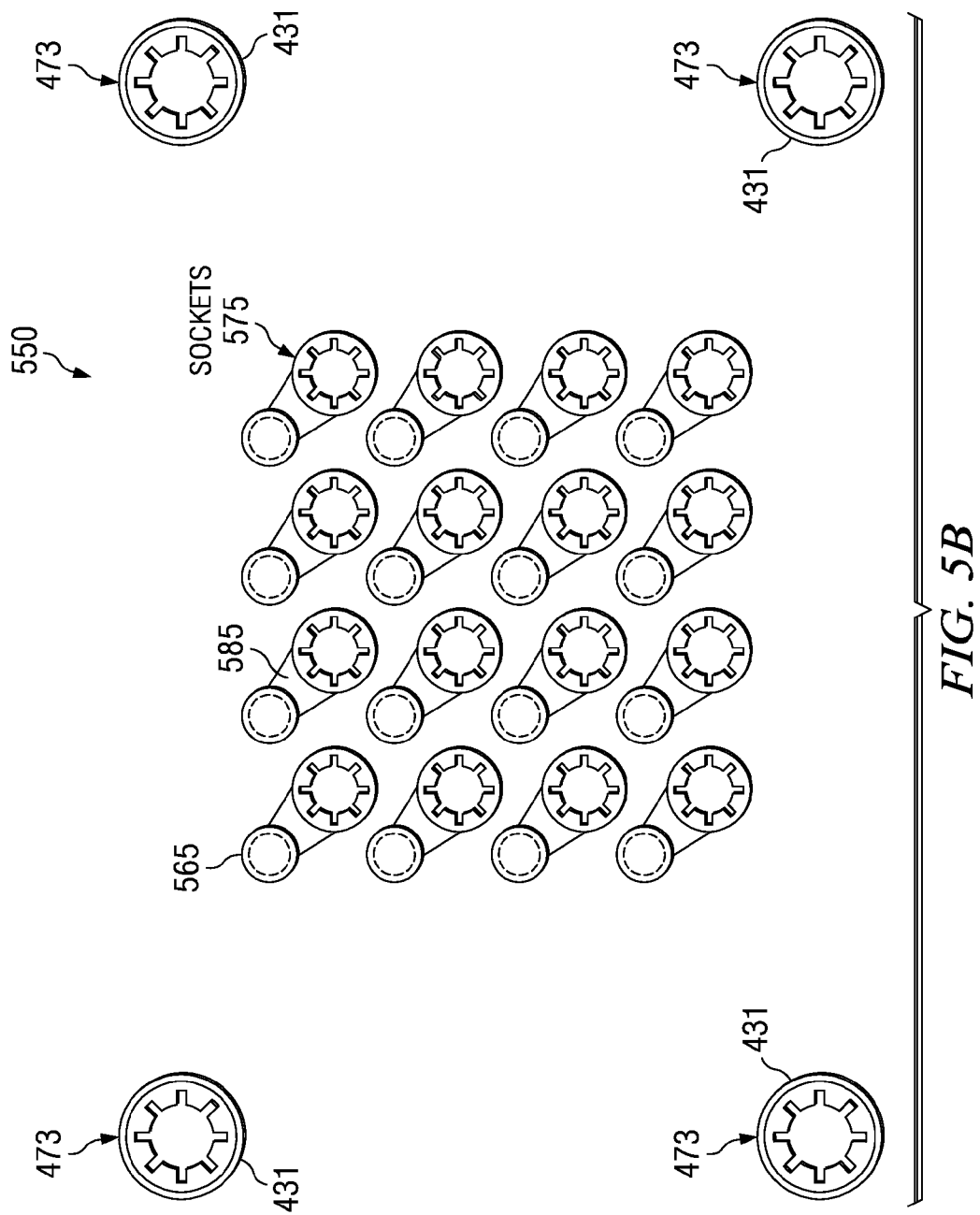

ELECTRONIC ASSEMBLIES INCLUDING MECHANICALLY SECURED PROTRUDING BONDING CONDUCTOR JOINTS

CROSS-REFERENCE TO RELATED APPLICATIONS

This application is a Divisional of and claims priority to U.S. application Ser. No. 12/572,615 filed on Oct. 2, 2009. Incorporated herein by reference.

FIELD

Electronic assemblies including integrated circuit (IC) die having protruding bonding features joined to a workpiece.

BACKGROUND

As known in the art, through-substrate vias (referred to herein as TSVs), which are commonly referred to as through-silicon vias, are vertical electrical connections that extend from one of the metal interconnect levels formed on the top surface of a wafer or IC die (e.g., one of the metal interconnect levels) to a location accessible from the bottom of the IC die. As a result, the TSV comprising device can be bonded face-up and utilize vertical electrical paths to couple from the bottom of the IC die to workpiece electrical connectors (e.g., attach or "land" pads) on other IC devices (e.g., on a die, wafer) or to mount onto a package substrate. The vertical electrical paths are significantly shortened relative to conventional wire bonding technology, generally leading to significantly faster device operation. TSVs generally include TSV tips that protrude a distance from the bottom of the IC die, such as a distance from 5 to 30 μms.

Pillars are another type of protruding conductive features used to join electronic devices. Pillars protrude from the top surface of the IC die and typically have a length from 10 to 50 μms. ICs having pillars are assembled in a flip chip configuration to attach pads on a workpiece.

Due to process variations as well as warpage induced bow, the length of the protruding bonding features (e.g., TSV tips, pillars or coined studs) across the IC die can vary significantly, such as having a range between 5 to 15 μm long. Non-uniformity in the length of the protruding bonding features across an IC die is conventionally addressed by using a solder thickness on the tip of the bonding features that is sufficient to compensate for the height difference (e.g., 15 μm thick solder for a length variation range of 10 μm). However, the solder compensating approach can lead to bonding problems such as variable solder amounts between the protruding bonding features (e.g., TSVs or pillars) and the electrical connectors (e.g., attach pads) on the workpiece surface. In regions where the solder is relatively thick, following bonding processing unreacted solder can remain which leads to variable electromigration (EM) performance, yield loss due to poor bonding (e.g., high resistance joints), and/or solder induced short circuits. Moreover, bond alignment inaccuracy can lead to variable bond integrity.

Some known solutions used to reduce the effects from non-uniformity in the length of the protruding bonding features include the use of a redistribution layer (RDL) pad over the protruding bonding features. The RDL approach adds extra wafer-level processing steps which results in extra cost, and has alignment complexities associated with backside wafer processing. Another known solution comprises chemical-mechanical planarization/chemical-mechanical polishing (CMP) of the bottom of the wafer to achieve improved co-planarity of the protruding bonding features. The CMP method adds an extra step and results in extra cost, and can damage the protruding bonding features, such as smearing of the metal filler or cracking of the dielectric liner in the case of TSVs.

SUMMARY

The Inventor has discovered that building receptacles having cavities (e.g., sockets) on the workpiece surface using a MEMS-like technique can be used to "capture" and fine align protruding bonding features (e.g., TSV tips, pillars or coined studs) on an IC die during assembly. The receptacles couple the protruding bonding features on the IC die to electrical connectors on the workpiece surface. The same MEMS-like technique can also be used to simultaneously form coarse self-aligning features on the workpiece surface to add relatively course alignment capability during assembly.

The receptacles described herein solve, or at least reduce, the problem of non-uniformity in length of the protruding bonding features across an IC die that as described above using the solder compensating approach can lead to variable solder amounts between protruding bonding features and the connector (e.g., attach pad) on the workpiece surface. Variable solder amounts can lead to variable EM performance, yield loss due to poor bonding, and/or result in solder-induced short circuits (e.g., solder shorting one attach pad to an adjacent attach pad).

Advantages of embodiments of the invention include height uniformity compensation for the tips of the protruding features without the need for conventional solder compensation. Embodiments of the invention include direct metal-metal contact (e.g., Cu—Cu), or in the case solder is used, the solder layer is thin enough (e.g., ≤5 μm) such that all the solder after bonding becomes entirely an intermetallic compound (IMC), so that there is no unalloyed solder in series in the joint which raises its resistance and degrades its electromigration lifetime. The aligning features of the receptacles described herein also provide a degree of self centering fine alignment, such as up to about 2 μm, which results in improved lateral joint alignment leading to lower resistance joints.

In disclosed embodiments, the contact area of the joints is at least primarily (and in some embodiments entirely) along the sidewall surfaces of the protruding bonding features (e.g., TSV tips), as opposed to the contact area from conventional joints made to conventional workpiece electrical connectors (e.g., attach pads) that are provided primarily by the leading edge surface of the protruding bonding features (e.g., TSV tip leading edge) to a metalized surface of the electrical connector (e.g., attach pads). Joints as disclosed herein made by the receptacles having cavities to the sidewall surfaces of the protruding bonding features have been found by the Inventor to provide insensitivity to length variations of the protruding bonding features across the IC die of up to about 5 to 6 μm. The joints can also provide radial pressure from the receptacles to the sidewall surfaces of the protruding bonding features sufficient to maintain physical contact (i.e. mechanical attachment) which allows a subsequent thermal cycle to be used to "set" the bond between sidewall the surface of the protruding tip and the receptacle to form a metallic joint, or a plurality of such joints simultaneously.

BRIEF DESCRIPTION OF THE DRAWINGS

FIGS. 1A-G shows successive cross sectional and top view depictions for an exemplary method for joining at least one IC die having at least one protruding bonding feature to a workpiece having an electrical connector and at least one receptacle including a cavity to form an electronic assembly, where the receptacle is connected to but is laterally offset from the electrical connector, according to an embodiment of the invention.

FIG. 5B is top view of workpiece having a socket side TSV and receptacle array coupled together by an RDL having the same pitch adapted for bonding to an IC die having at least one protruding bonding feature, according to an embodiment of the invention.

DETAILED DESCRIPTION

Figure 1A:
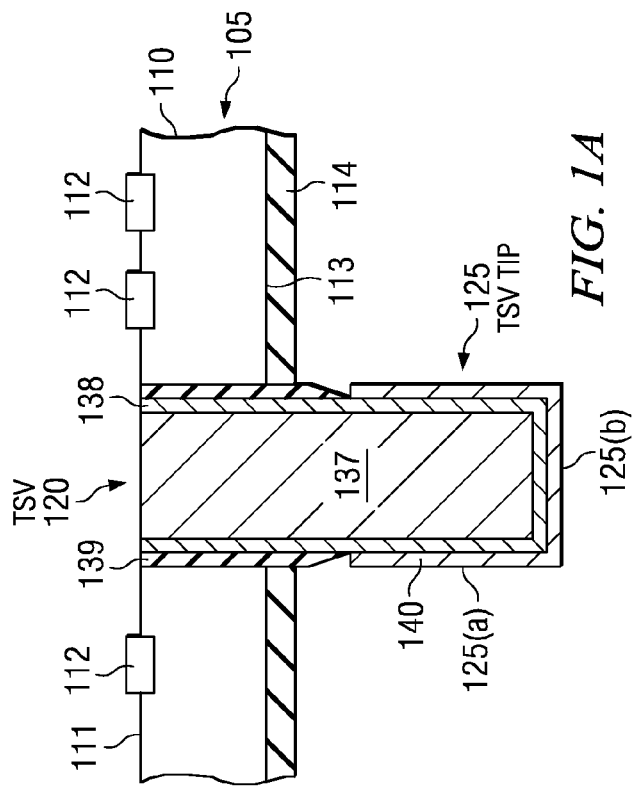

Disclosed embodiments are described with reference to the attached figures, wherein like reference numerals are used throughout the figures to designate similar or equivalent elements. The figures are not drawn to scale and they are provided merely to illustrate embodiments of the invention. Several aspects of the invention are described below with reference to example applications for illustration. It should be understood that numerous specific details, relationships, and methods are set forth to provide a full understanding of embodiments of the invention. One having ordinary skill in the relevant art, however, will readily recognize that embodiments of the invention can be practiced without one or more of the specific details or with other methods. In other instances, well-known structures or operations are not shown in detail to avoid obscuring embodiments of the invention. Embodiments of the invention are not limited by the illustrated ordering of acts or events, as some acts may occur in different orders and/or concurrently with other acts or events. Furthermore, not all illustrated acts or events are required to implement a methodology in accordance with embodiments of the invention.

FIGS. 1A-G shows successive cross sectional and top view depictions for an exemplary method for joining at least one IC die having at least one protruding bonding feature to a workpiece having an electrical connector and at least one receptacle including a cavity to form an electronic assembly, where the protruding bonding feature is bonded to the receptacle, and the receptacle is connected to but is laterally offset from the electrical connector, according to an embodiment of the invention. Embodiments of the invention are applicable for wafer-to-wafer bonding, die-to-wafer bonding, and die-to-die bonding. It is noted that receptacle generation is generally in wafer form for die-to-die embodiments.

Now referring to FIG. 1A, a cross sectional depiction of an incoming IC die to assembly (after wafer fabrication is completed) 105 is shown, according to an embodiment of the invention. The IC die 105 can be a singulated die or in wafer form together with a plurality of other IC die. The IC die 105 comprises a substrate 110 including a semiconductor top surface 111 having active circuitry 112 thereon and a bottom surface 113. Active circuitry 112 generally comprises transistors, diodes, capacitors, and resistors, as well as signal lines and other conductors that interconnect these various circuit elements. An optional dielectric layer 114 is shown on the bottom surface 113 of substrate 110. IC 105 includes a protruding bonding feature shown as a plug TSV tip 125 having sidewall surfaces 125(a) and a leading edge surface 125(b) extending from the bottom surface 113 of the IC die 105 that is the distal portion of TSV 120.

TSV 120 comprises a TSV filler material (e.g., polysilicon, copper, tungsten or other metal) 137. The TSV filler material 137 is shown surrounded by diffusion barrier metal (e.g., Ta, TaN, Ti, TiN, Mn, or Ru, or combinations thereof) 138 that is used when TSV filler material 137 comprises a fast diffusing minority carrier lifetime killing metal, such as copper in the case of silicon. An outer dielectric liner 139 is shown on the diffusion barrier metal 138 that extends for only a portion of the length of the plug TSV tip 125. For example, if the plug TSV tip 125 protrudes 5 µm from bottom surface 113, the outer dielectric liner 139 can be absent on the outermost distal end of the plug TSV tip 125, such as absent from the last 3 µm of plug TSV tip 125. Although diffusion barrier metal 138 is shown on the distal end of plug TSV tip 125 in FIGS. 1A, 1F and 1G, diffusion barrier metal 138 need not be present on the distal end of the TSV tip, as would be the case if the plug TSV tip 125 were exposed by a CMP process.

The diameter of TSV 120 and plug TSV tip 125 is generally <50 µm. In one embodiment, the TSV diameter is ≤15 µm, such as 5 to 15 µm.

An optional solder layer (e.g., Sn or SnAg) 140 is shown on the distal end of the plug TSV tip 125. In a typical embodiment, the solder layer 140 has a thickness of ≤5 µm so that after bonding the solder layer 140 becomes entirely an intermetallic compound (IMC), so that there is no unalloyed solder in series in the joint that can significantly raise the resistance of the joint. It is noted that there could also be Ni, Pd, Au or combination thereof instead of solder layer 140, or optionally covered by solder layer 140. If present, Ni and Pd would block the formation of intermetallic compounds (IMC) between the TSV in the case TSV filler material 137 comprises Cu and Sn. Moreover, it is noted that layer 140 may comprise an initial additional Cu layer to "grow" the diameter of the plug TSV tip 125 for better "tightness of fit" into the receptacle, as disclosed below.

Although the protruding bonding feature for IC 105 is shown as a plug TSV tip 125 in FIG. 1A, in other embodiments, the protruding bonding feature can be a pillar or coined stud that protrudes from the semiconductor top surface 111. In the case of a pillar, the pillar generally comprises copper and protrudes about 10 to 50 μm from the semiconductor top surface 111.

FIG. 1B shows a cross sectional and top view depiction of a workpiece embodied as a post-fabrication wafer 135 having a plurality of IC die after a first step of receptacle formation, according to an embodiment of the invention. Although the workpiece is generally described herein as be a wafer, the workpiece can also be an arrayed plurality of workpiece IC die, such as when multiple workpieces are reconstituted into a sheet or circle. Each IC die on wafer 135 includes at least one electrical connector comprising a receptacle side TSV 192 that comprises diffusion barrier metal 138 and the TSV filler metal 188 that provides an electrical connection from the bottom workpiece surface 141 of the wafer 135 to the semiconductor top surface 142 of wafer 135 that includes active circuitry (not shown). The bottom workpiece surface 141 includes a dielectric layer 144. Although receptacle side TSV 192 is shown having a tip 188(*a*) that protrudes from the bottom workpiece surface 141, alternatively, the receptacle side TSV 192 can lack a tip and be flush or recessed relative to the bottom workpiece surface 141. The electrical connector shown as receptacle side TSV 192 can also alternatively be another contact structure, such as a conventional bond pad. Other than wafer 135, the workpiece having the receptacles can comprise a package substrate, such as a PCB. In the PCB embodiment, the PCB can include an interposer.

Figure 5A:
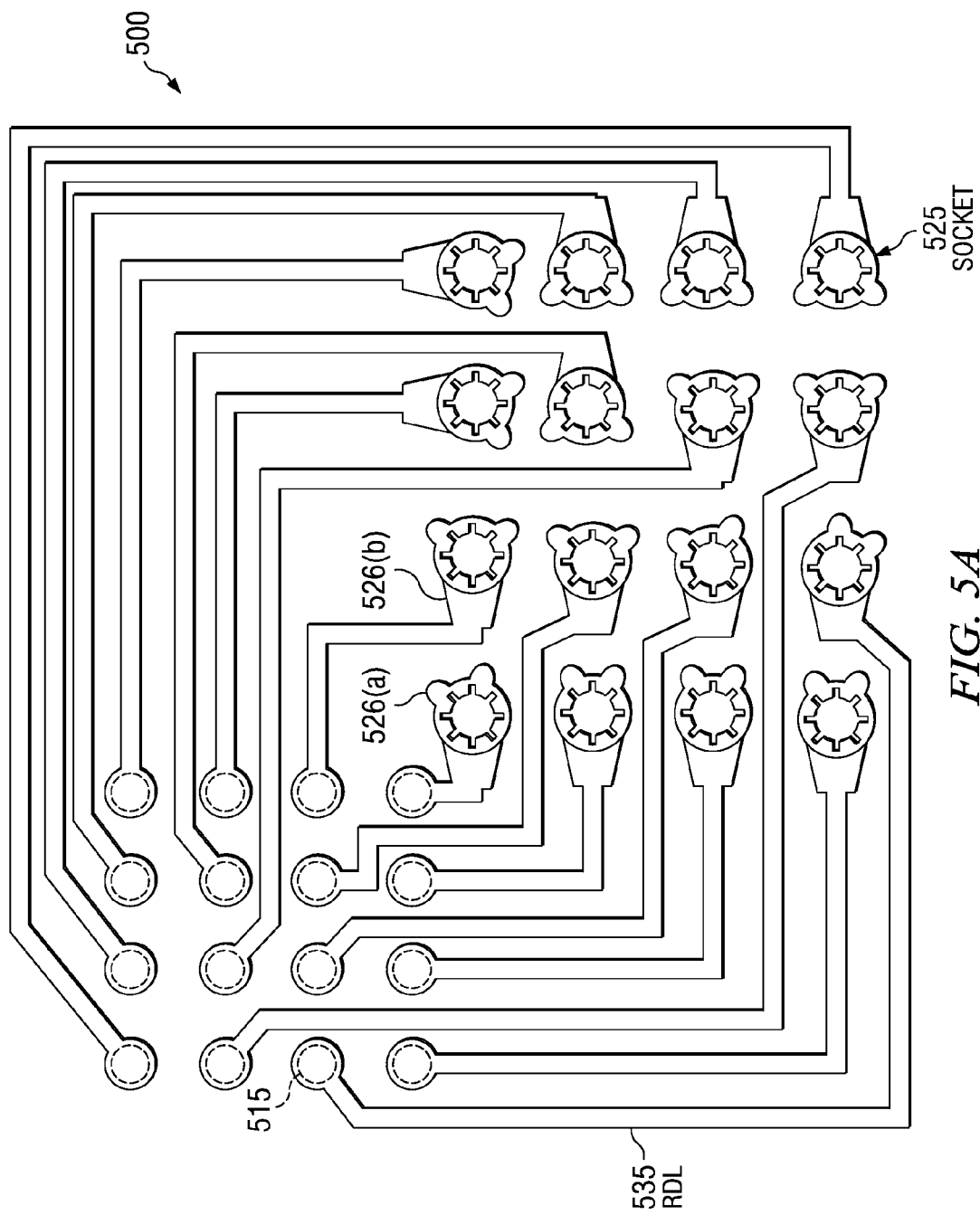
FIG. 5A is a top view of workpiece having a socket side TSV and receptacle array coupled together by an RDL having different pitches adapted for bonding to an IC die having at least one protruding bonding feature, according to an embodiment of the invention.

As described above, receptacles having cavities on the bottom workpiece surface 141 are built on the workpiece surface that "capture" and fine-align protruding bonding features of an IC die, such as plug TSV tip 125 shown in FIG. 1A, for joining the IC die to the workpiece surface. In the embodiment shown, the mesa 150 of selectively removable material shown on the bottom workpiece surface 141 is positioned laterally a distance sufficiently large to ensure that the mesa 150 does not touch receptacle side TSV 192, otherwise, any region of receptacle side TSV 192 such as TSV filler metal 188 that is overlapped by the mesa 150 will be excluded from the eventual electrical interface. Moreover, in embodiments where receptacle side TSV 192 protrudes upwards from or recesses below bottom workpiece surface 141, there could be processing problems in the formation of the mesa 150 itself. For the scenario depicted in FIG. 5B described below, typical lateral separation would be on the order of 5-50 μm, but as shown in FIG. 5A, can be arbitrarily large, such as >50 μm.

The mesa 150 of selectively removable material shown in FIG. 1B is generally described herein as comprising a photoresist since photoresist has the advantage of being photo-imagable. However, the mesa 150 of selective removable material 150 can also comprise other sacrificial (i.e. selectively removable) materials such as spin on dielectrics, including polymers, polysilicon or oxides (e.g., silica). For photoresist, a typical process sequence to form the mesa 150 of selectively removable material comprises conventional spinning on of photoresist and patterning/developing to form the mesa 150. Although shown in FIG. 1B having a straight wall, the mesa 150 can have a sloped sidewall.

The height and width of the mesa 150 are generally set based on the tip dimensions of the protruding bonding feature, such as plug TSV tip 125 in FIG. 1A. For example, the height can be set based on the estimated insertion distance of the plug TSV tip 125 or other protruding bonding feature into the later formed cavity of the receptacle, such as from about 3 to 10 μm and the width is larger than that of the protruding bonding feature, such as 120 to 140% of the diameter of the plug TSV tip 125 or other protruding bonding feature so that the cavity subsequently formed has a sufficient area to surround the plug TSV tip 125 or other protruding bonding feature after insertion.

Figure 1C:
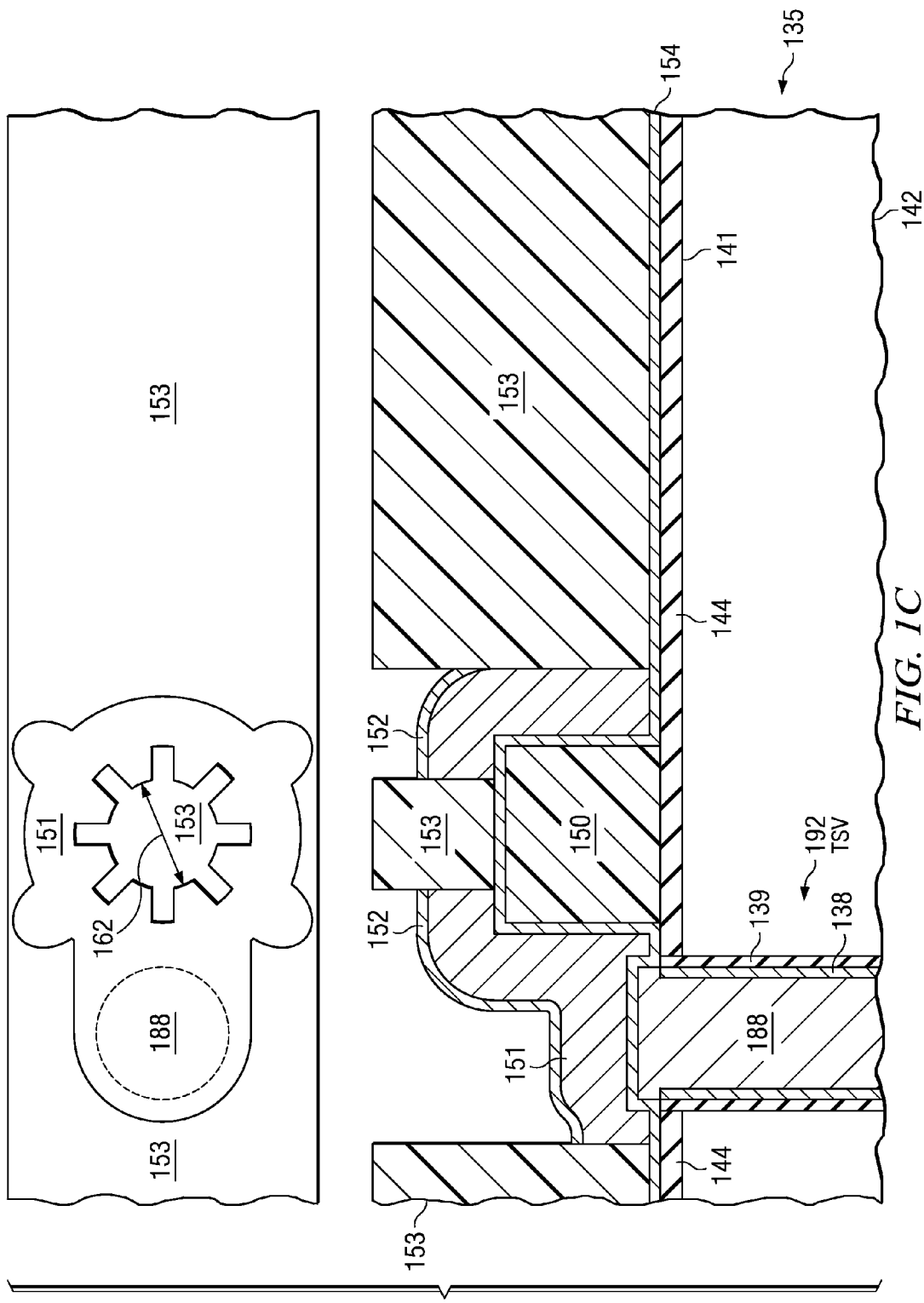

FIG. 1C shows a cross sectional and top view depiction of the workpiece embodied as a wafer 135 in an intermediate step of receptacle formation following metal formation on the mesa 150 and over the adjacent receptacle side TSV 192. Metal formation on the mesa 150 and over the adjacent receptacle side TSV 192 can be performed concurrently with RDL processing, where the RDL provides the lateral electrical coupling from the receptacle to the electrical connector on the workpiece surface. For example, in one embodiment, a Cu seed (with optional under-bump metal [UBM] barrier) 154 is deposited, a thick photoresist pattern 153 is applied, and then metal layer 151 such as Cu (e.g., 3-10 μm thick) along with an optional metallic protective coating 152 (e.g., Ni/Pd/Au) are plated within the open regions of the pattern. The photoresist pattern 153 can be incorporated into an RDL pattern level.

The "sprocket" pattern shown in the top view provided in FIG. 1C is just one example of many possible top surface patterns for the receptacle. The dimension shown as 162 in FIG. 1C is referred to below as opening or gap 162 that results upon removal of photoresist pattern 153. The minimum width of the photoresist pattern 153 over the metal over the mesa 150 is generally less than the width of the protruding bonding feature, such as the diameter of the plug TSV tip 125 described above.

Figure 1D:
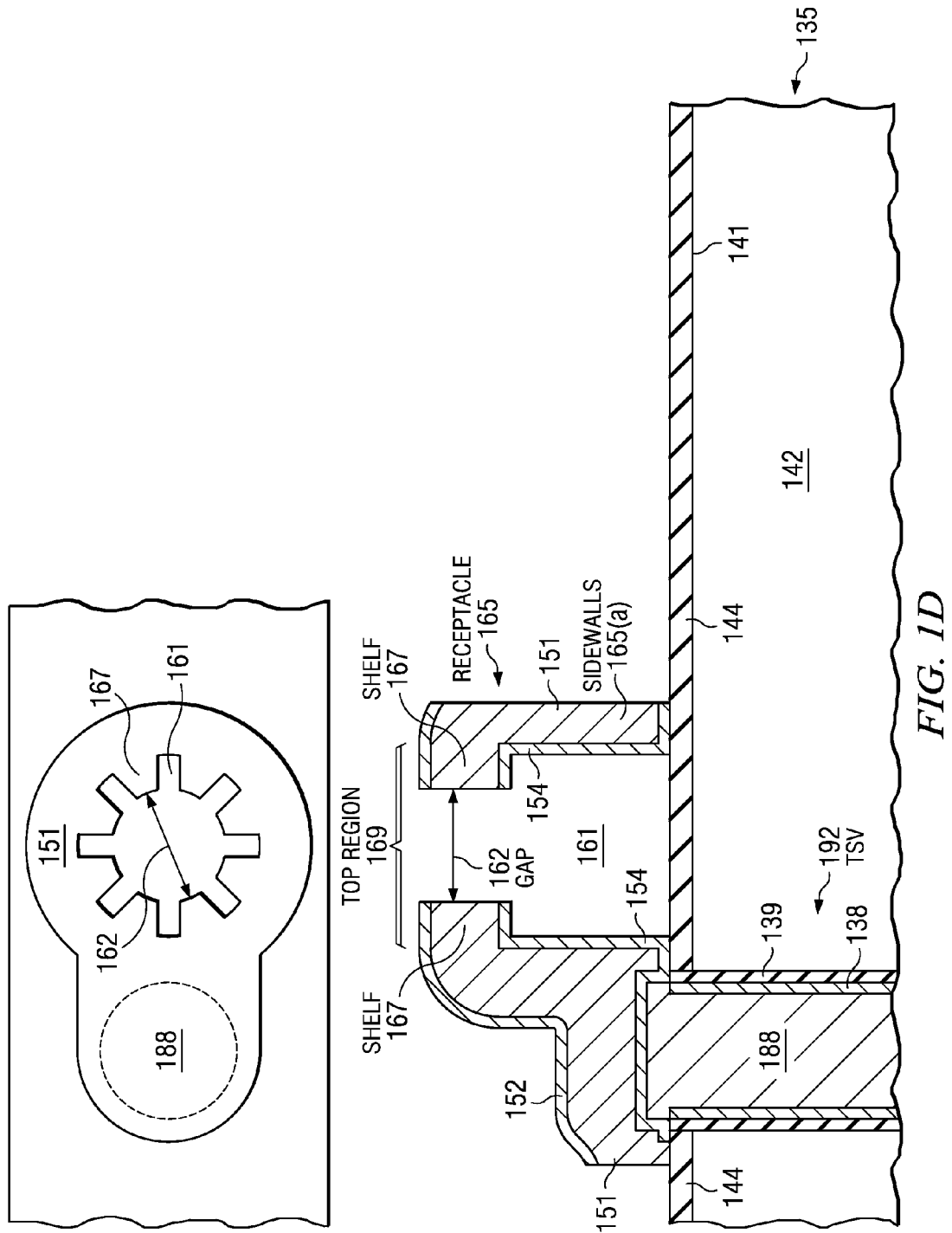

FIG. 1D shows a cross sectional and top view depiction of the workpiece embodied as a wafer 135 shown in FIG. 1C following the steps of removal of photoresist pattern 153, the removal of the seed layer 154 under the photoresist pattern 153, and the removal of the mesa 150 comprising selectively removable material (e.g., photoresist) to form a metal framed hollow receptacle 165. Metal framed hollow receptacle 165 comprises a cavity 161 having peripheral shelf regions 167 and sidewalls 165(*a*) that define an opening or gap 162 at the top surface of the receptacle 165. Top region 169 of metal framed hollow receptacle 165 is shown comprising peripheral shelf regions 167 and gap 162 that provides an entrance to the cavity 161. As described above, the fine aligning features of the receptacle 165 shown provides a degree of self centering fine alignment, such as up to about 2 μm, which results in improved lateral joint alignment leading to lower resistance joints.

Figure 1E:
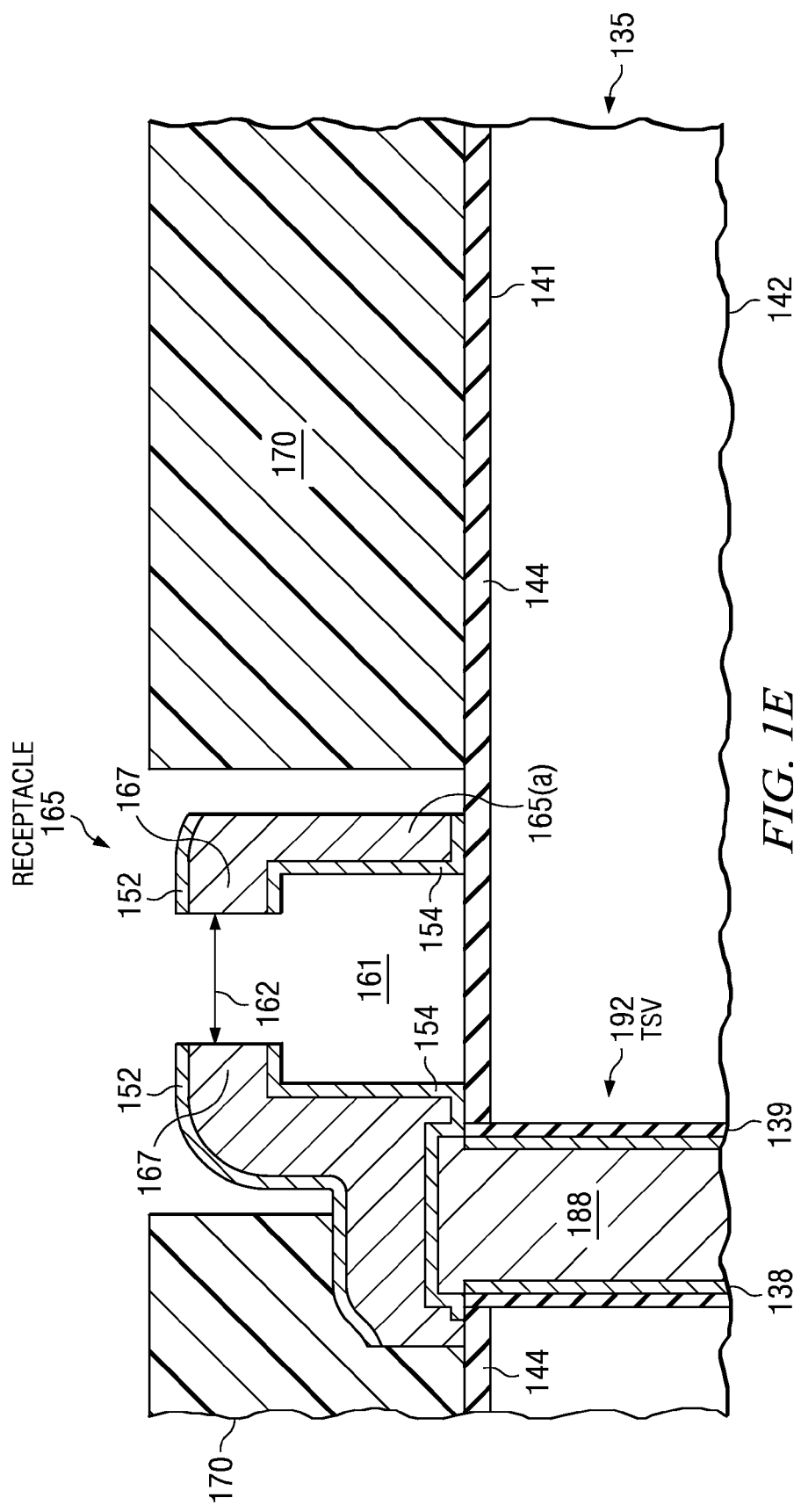

FIG. 1E shows a cross sectional depiction of the workpiece shown in FIG. 1D embodied as wafer 135 after optional application of an adhesive layer 170 following formation of receptacle 165. The height (thickness) of the adhesive layer 170 is generally greater than the height of the receptacle 165 to provide a minimum spacing control function to establish a minimum spacing between the workpiece shown as wafer 135 and the IC die 105 after pressing together and accompanying insertion of TSV tip 125 into receptacle 165. For example, photo-imageable adhesive (e.g., DuPont HD7000) can be spun on, developed then cured. The distance between the adhesive layer 170 and the receptacle 165 can be set for the particular application and will generally depend upon area (e.g. diameter) of receptacle 165 and its spacing to nearest neighbor receptacle(s) 165.

Figure 1F:
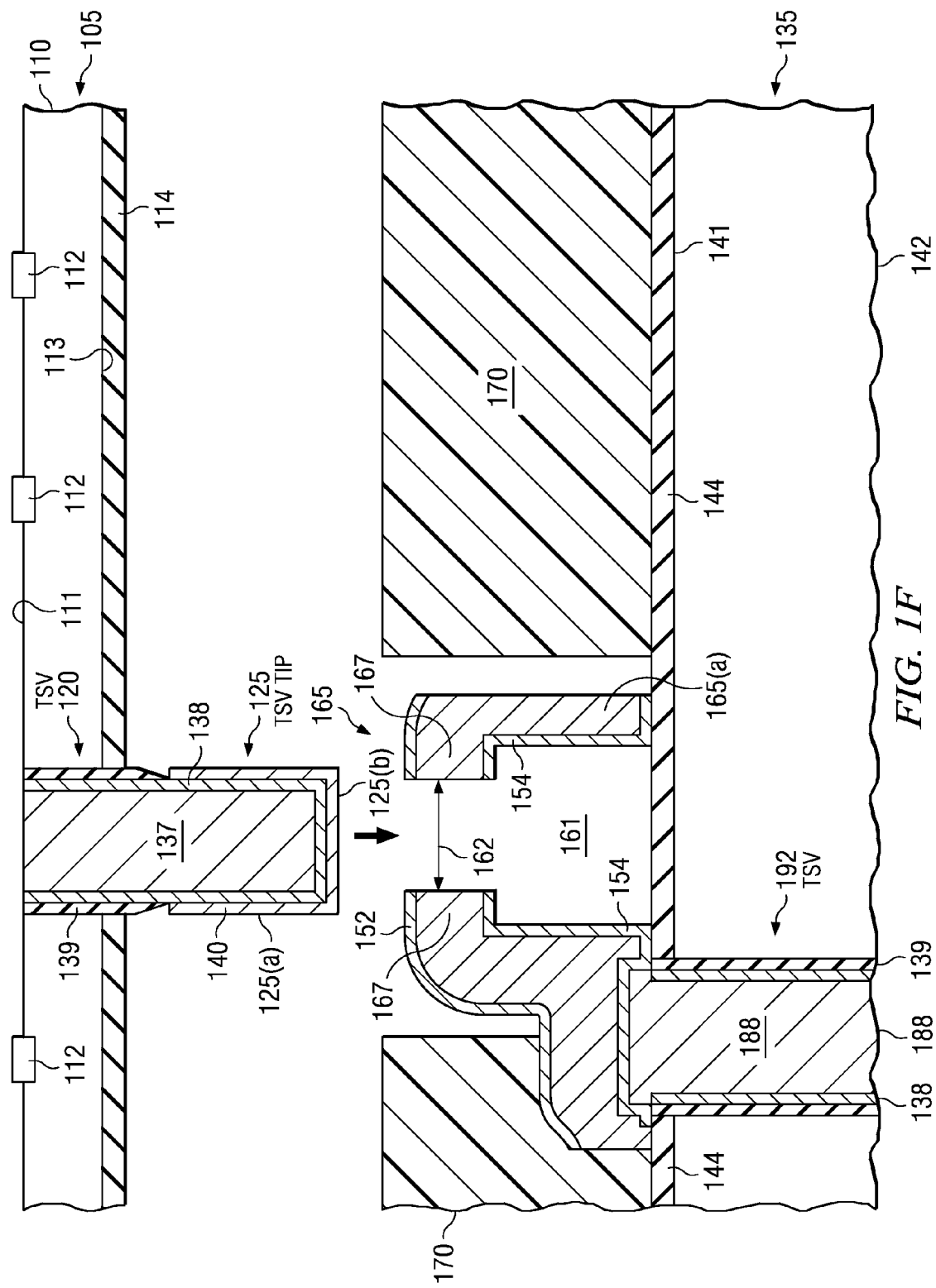

FIG. 1F shows a cross sectional depiction of the IC die 105 shown in FIG. 1A above the workpiece shown as wafer 135 in FIG. 1E just before being pressed together. The downward pointing arrow shown indicates the direction of movement of the plug TSV tip 125 towards the wafer 135.

Figure 1G:
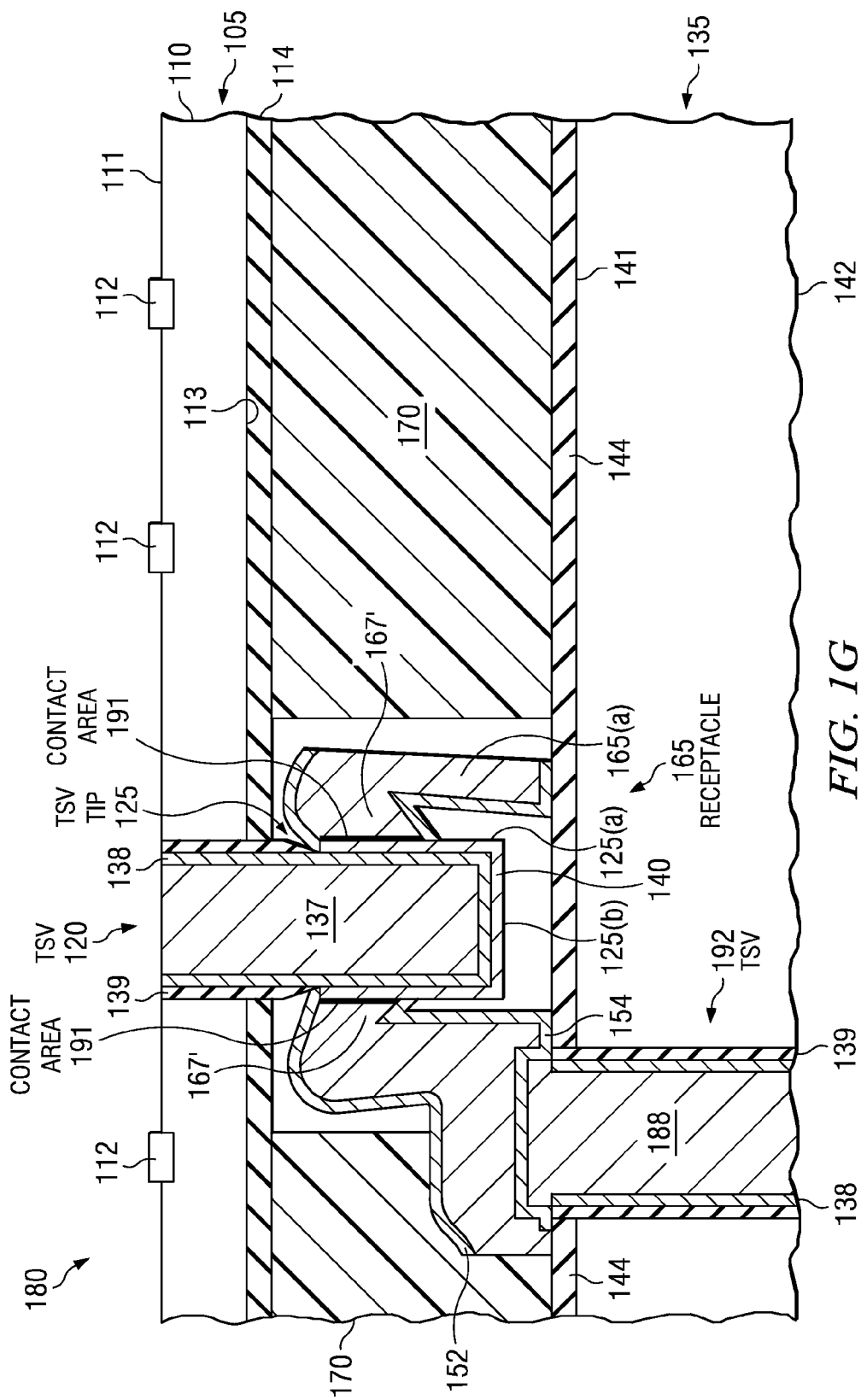

FIG. 1G shows a cross sectional depiction of an electronic assembly 180 comprising the IC die 105 shown in FIG. 1A after pressing and insertion of plug TSV tip 125 into the cavity 161 of the receptacle 165 to establish contact to the workpiece shown as wafer 135 which joins plug TSV tip 125 to the receptacle 165 (which as described above is coupled to receptacle side TSV 192). The protruding bonding feature shown as TSV tip 125 is inserted into cavity 161 through what had been opening 162 of receptacle 165 shown in FIG. 1F. The pressing can be seen to have bent the peripheral shelf regions 167 shown in FIG. 1F downward into the cavity 161 and towards the sidewall portion 168 of the receptacle to form bent peripheral shelf regions 167', wherein the protruding bonding feature shown as plug TSV tip 125 contacts the bent peripheral shelf regions 167' along contact areas 191. The contact areas 191 are shown in FIG. 1G as being entirely along the sidewall surfaces 125(a) of the protruding bonding feature shown as plug TSV tip 125. However, the contact areas 191 are generally at least primarily along the sidewall surfaces 125(a) of the protruding bonding feature shown as plug TSV tip 125. In one embodiment the pressing is performed at room temperature or near room temperature, such as to provide direct metal-metal joint (e.g., Cu—Cu).

The method can further comprise a thermal connection process after pressing in embodiments where the pressing may not provide a metallic joint. In this embodiment, a thermal connection process is used to form a metallic joint along the contact area between the protruding bonding feature and the receptacle. The thermal connection process is generally performed at a temperature ≤260° C. in the case of a solder mediated joint.

Figure 2A:
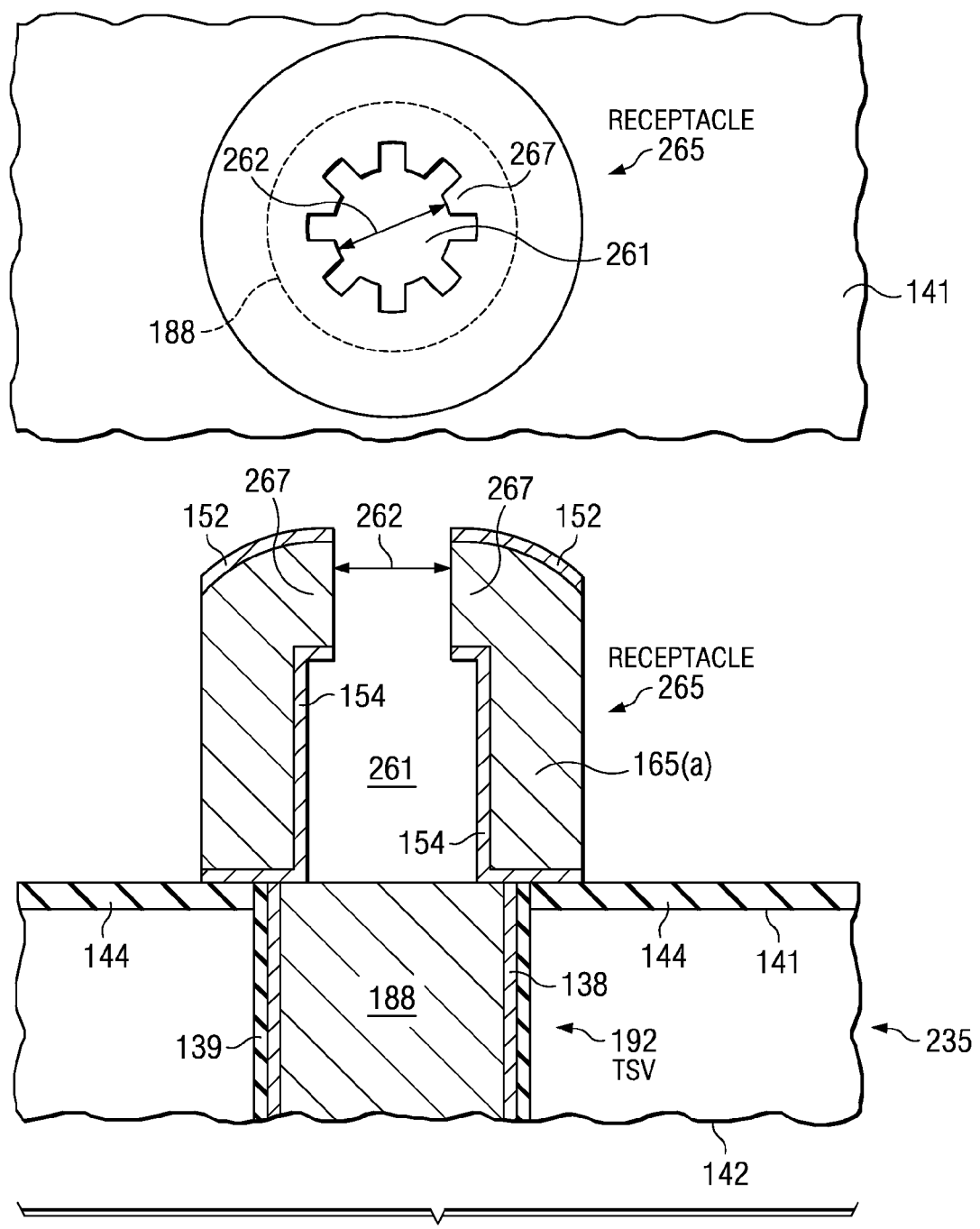
FIGS. 2A-C show successive cross sectional depictions for selected steps in an exemplary method for joining at least one IC die having at least one protruding bonding feature to a workpiece having an electrical connector and at least one receptacle including a cavity to form an electronic assembly, where the receptacle is connected to and is concentric with the electrical connector, according to an embodiment of the invention.
Figure 2B:
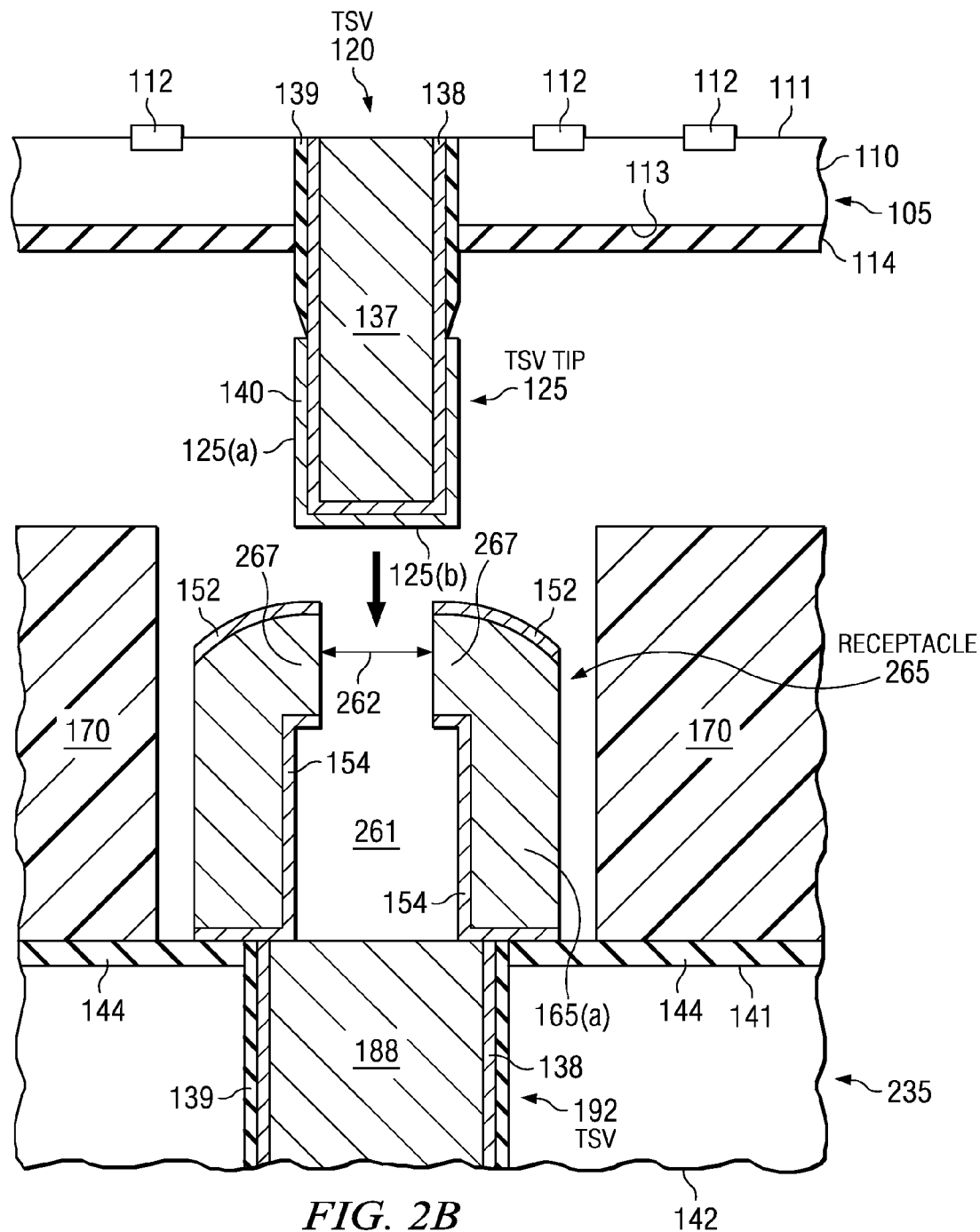
Figure 2C:
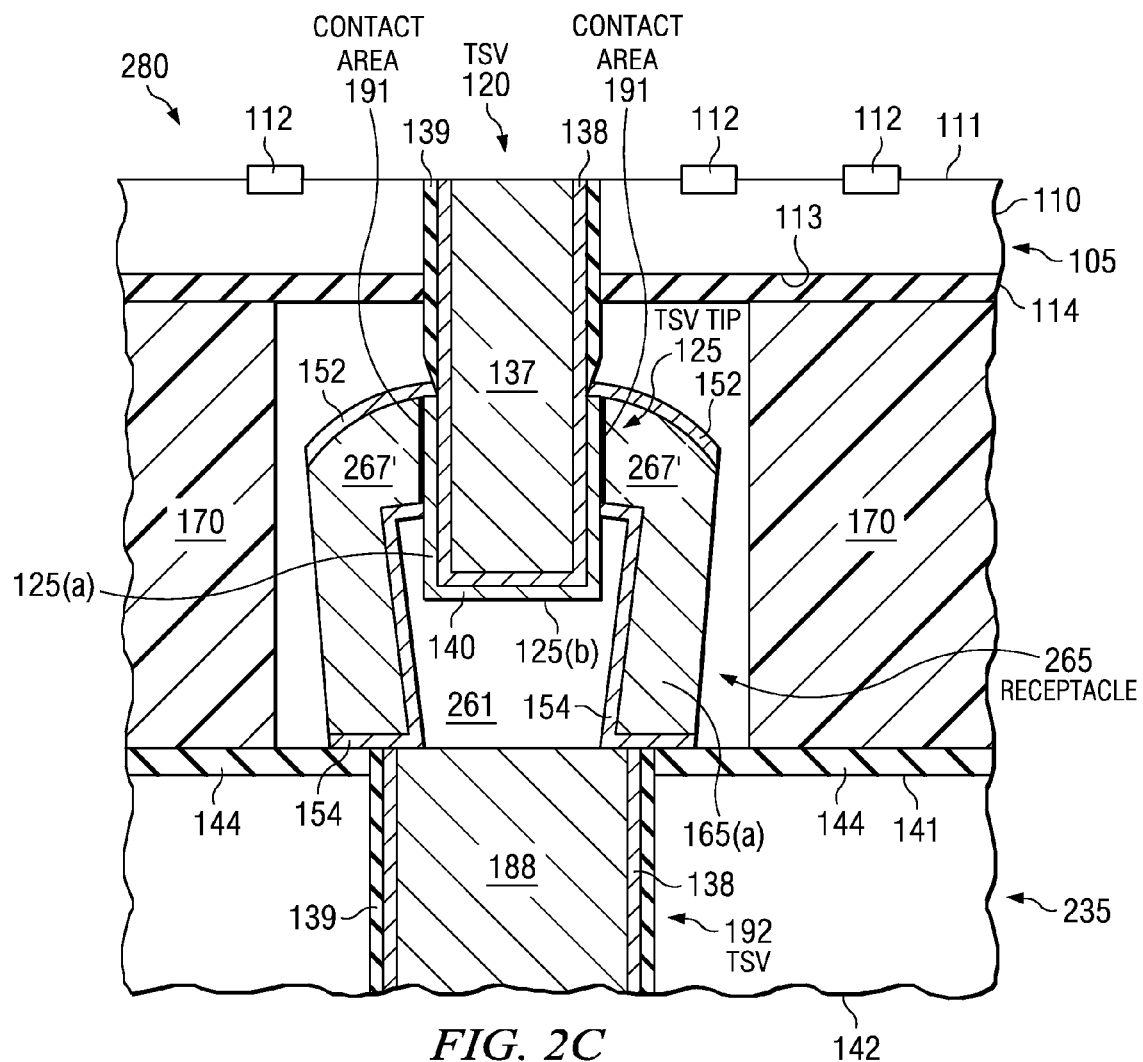

FIGS. 2A-C show successive cross sectional depictions for selected steps in an exemplary method for joining at least one IC die having at least one protruding bonding feature to a workpiece having an electrical connector and at least one receptacle including a cavity to form an electronic assembly, where the protruding bonding feature is bonded to the receptacle, and the receptacle is connected to and is concentric with the electrical connector, according to an embodiment of the invention. FIG. 2A shows a cross sectional and top view depiction of the workpiece embodied as a wafer 235 following the steps of removal of photoresist pattern and removal of the seed layer 154 under the photoresist pattern to form a metal framed hollow receptacle 265 comprising a cavity 261 having peripheral shelf regions 267 that define an opening or gap 262 at the top surface of the receptacle 265. Other than the receptacle 265 being concentric with the workpiece electrical connector shown as receptacle side TSV 192, the cross sectional depiction shown in FIG. 2A is analogous to the cross sectional depiction shown in FIG. 1D (and previous steps and associated processing and depictions shown and described relative to FIGS. 1A-C generally apply).

FIG. 2B shows a cross sectional depiction of the IC die 105 shown in FIG. 1A above the workpiece 235 shown in FIG. 2A with an added adhesive layer 170 just before being pressed together. The downward pointing arrow shown shows the direction of movement of the plug TSV tip 125 towards workpiece 235. Other than the receptacle 265 being concentric with the workpiece electrical connector shown as receptacle side TSV 192, the cross sectional depiction shown in FIG. 2B is analogous to the cross sectional depiction shown in FIG. 1F.

FIG. 2C shows a cross sectional depiction of an electronic assembly 280 comprising the IC die 105 shown in FIG. 1A after pressing and insertion of plug TSV tip 125 into the cavity 261 of the receptacle 265 to establish electrical connection to the workpiece 235 which joins plug TSV tip 125 to the receptacle 265. The protruding bonding feature shown as TSV tip 125 is inserted into cavity 261 through what had been gap or opening 262 of the receptacle 265 shown in FIG. 2A. The pressing can be seen to have bent the peripheral shelf regions 267 shown in FIGS. 2A and 2B downward into the cavity 261 and towards the sidewall portion 268 of the receptacle to form bent peripheral shelf regions 267', wherein the protruding bonding feature shown as plug TSV 125 contacts the bent peripheral shelf regions 267' along contact areas 191, wherein the contact areas 191 are shown as being optionally entirely along the sidewall surfaces 125(a) of the protruding bonding feature shown as plug TSV tip 125.

Figure 3A:
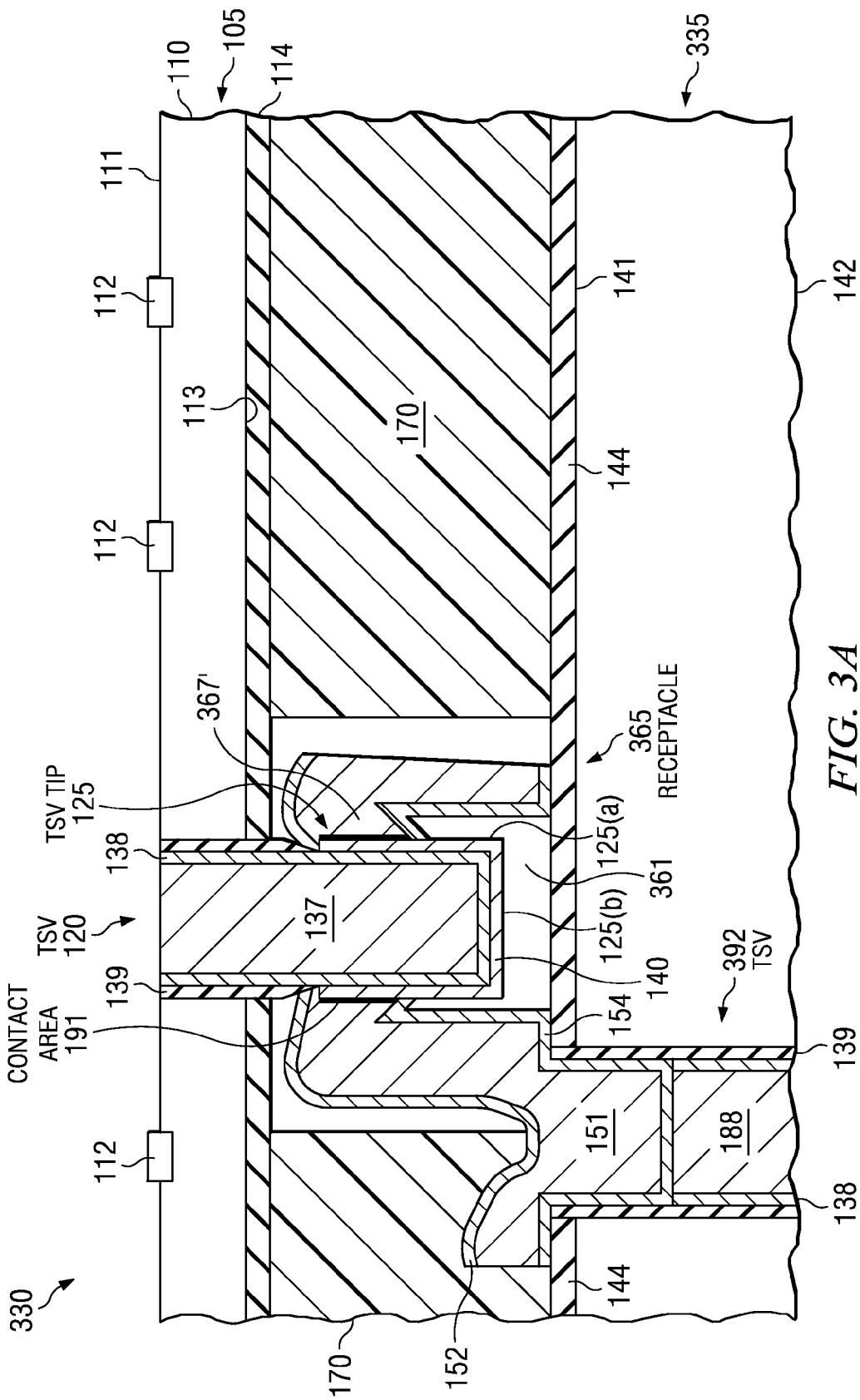
FIG. 3A shows a cross sectional depiction of an electronic assembly comprising the IC die shown in FIG. 1A after pressing and insertion of plug TSV tip into the cavity of the receptacle to establish electrical connection to the workpiece which joins plug TSV tip to the receptacle, wherein the receptacle side TSV is recessed relative to the bottom workpiece surface, according to an embodiment of the invention.

FIG. 3A shows a cross sectional depiction of an electronic assembly 330 comprising the IC die 105 shown in FIG. 1A after pressing and insertion of plug TSV tip 125 into the cavity 361 of the receptacle 365 to establish electrical connection to the workpiece 335 which joins plug TSV tip 125 to the receptacle 365 which as described above is coupled to receptacle side TSV 392, wherein the receptacle side TSV 392 is recessed relative to the bottom workpiece surface 141, according to an embodiment of the invention. The protruding bonding feature shown as TSV tip 125 is inserted into cavity 361 through what had been opening 162 of receptacle 165 shown in FIG. 1F. The pressing can be seen to have bent the peripheral shelf regions 167 shown in FIG. 1F downward into the cavity 161 and towards the sidewall portion 168 of the receptacle 365 to form bent peripheral shelf regions 367', wherein the protruding bonding feature shown as plug TSV tip 125 contacts the bent peripheral shelf regions 167' along contact areas 191.

Figure 3B:
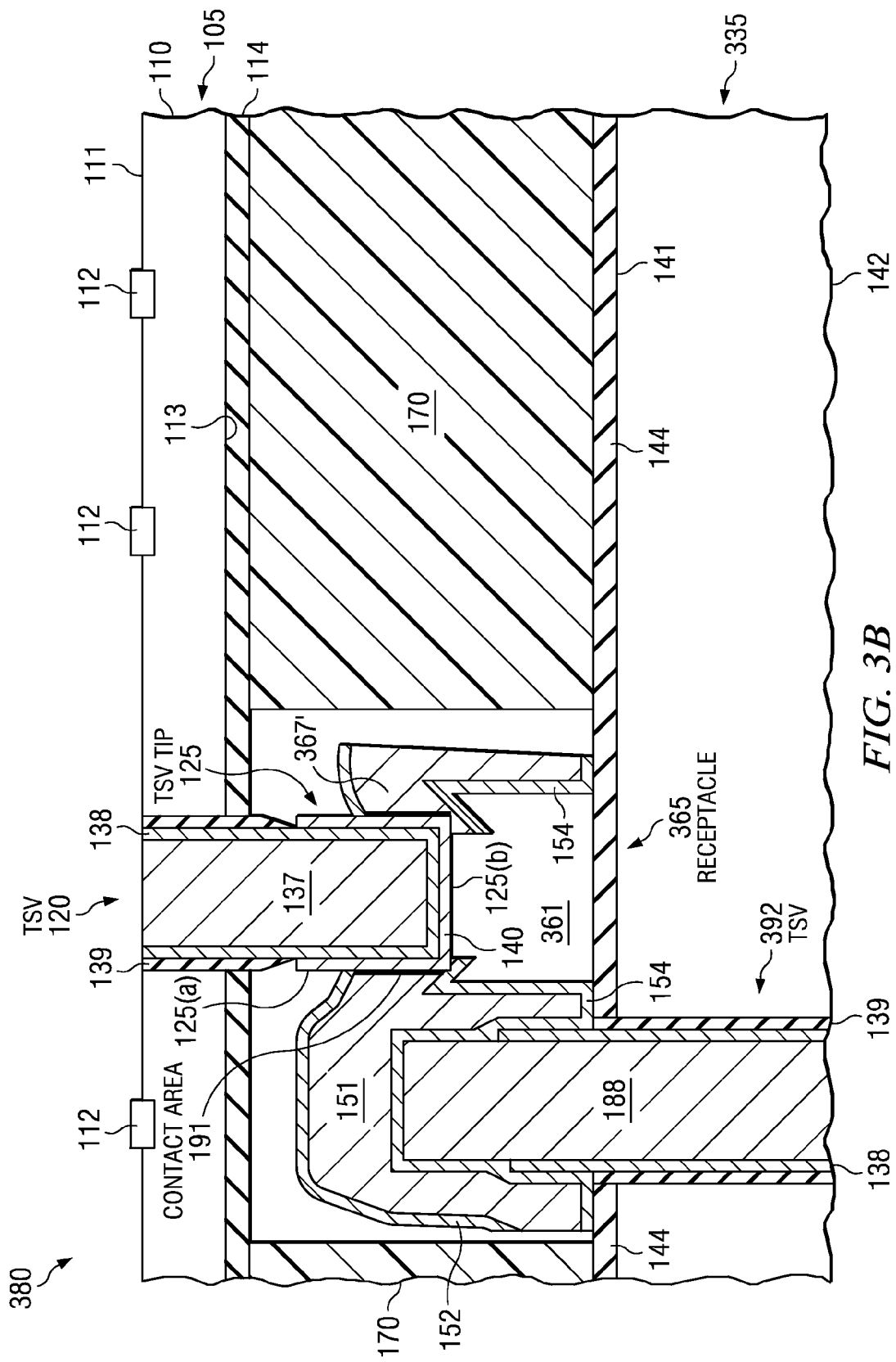
FIG. 3B shows a cross sectional depiction of an electronic assembly comprising the IC die shown in FIG. 1A after pressing and insertion of plug TSV tip into the cavity of the receptacle to establish electrical connection to the workpiece which joins plug TSV tip to the receptacle, wherein the receptacle side TSV is protruding relative to the bottom workpiece surface, according to an embodiment of the invention.

FIG. 3B shows a cross sectional depiction of an electronic assembly 380 comprising the IC die 105 shown in FIG. 1A after pressing and insertion of plug TSV tip 125 into the cavity 361 of the receptacle 365 to establish electrical connection to the workpiece 335 which joins plug TSV tip 125 to the receptacle 365 which as described above is coupled to receptacle side TSV 392, wherein the receptacle side TSV 392 is protruding relative to the bottom workpiece surface 141, according to an embodiment of the invention. The protruding bonding feature shown as TSV tip 125 is inserted into cavity 361 through what had been opening 162 of receptacle 165 shown in FIG. 1F. The pressing can be seen to have bent the peripheral shelf regions 167 shown in FIG. 1F downward into the cavity 161 and towards the sidewall portion of the receptacle 365. to form bent peripheral shelf regions 367'. The protruding bonding feature shown as plug TSV tip 125 contacts the bent peripheral shelf regions 167' along contact areas 191, In this embodiment the height (i.e. thickness) of the adhesive layer 170 is adjusted to be higher than the top of the stack above TSV 392.

Figure 4B:
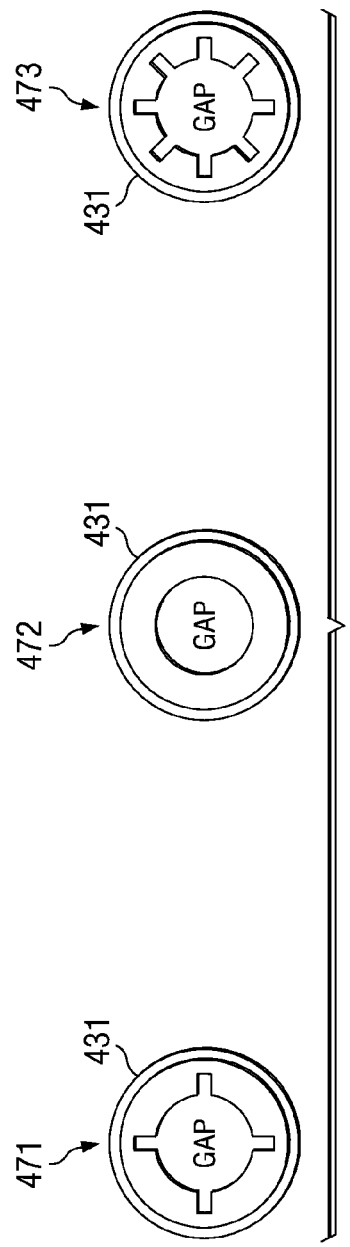
FIG. 4B shows some exemplary alignment embodiments for the course alignment receptacles shown in FIG. 4A.
Figure 4A:
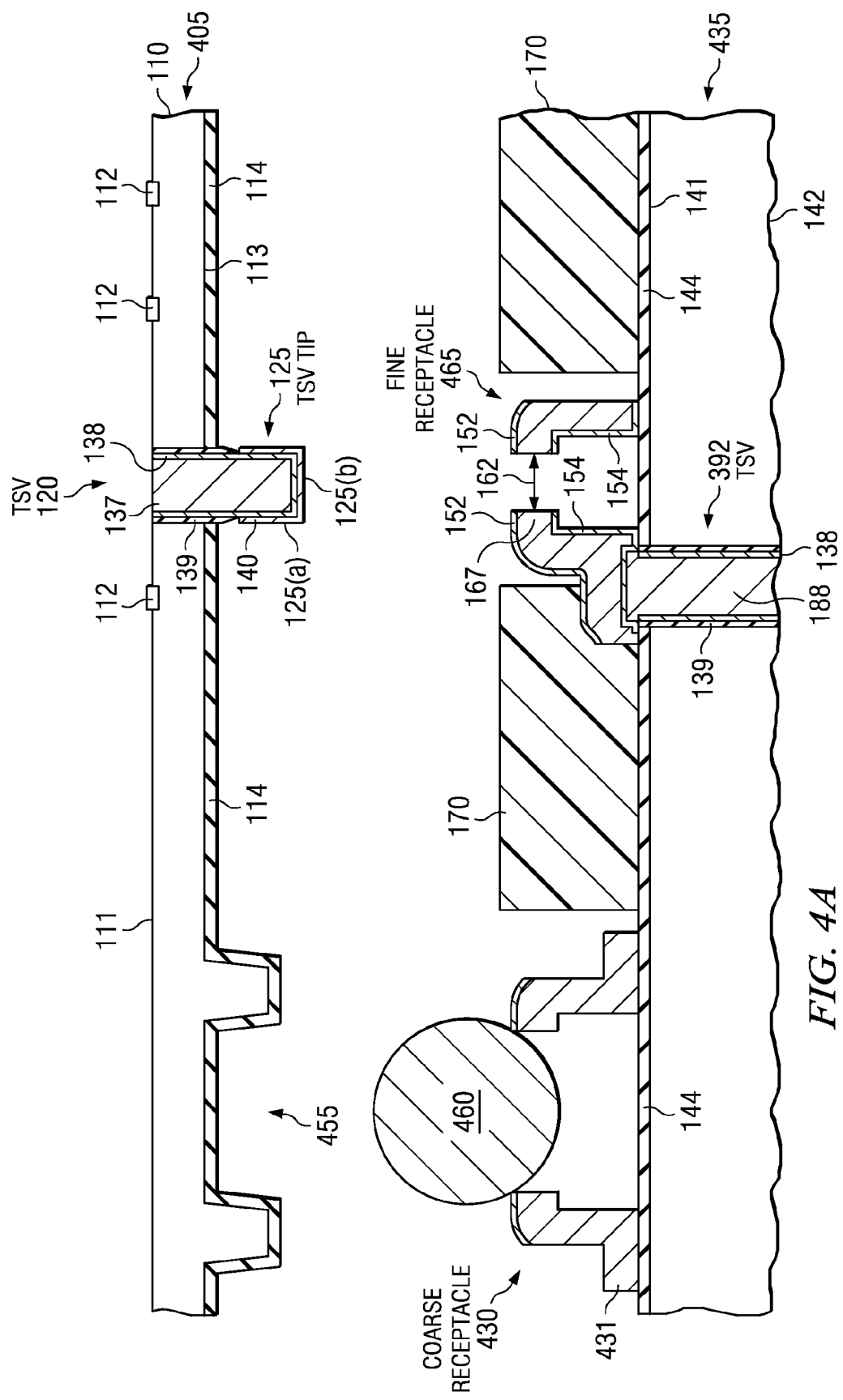
FIG. 4A shows a depiction of a workpiece having at least one receptacle and at least one alignment receptacle configured for holding a metal ball for course alignment of an IC die having at least one protruding bonding feature and one coarse alignment feature shaped to fit over the metal (e.g., solder) ball, according to an embodiment of the invention.

FIG. 4A shows a depiction of a workpiece 435 having at least one fine alignment electrical connection receptacle 465 and at least one course alignment receptacle 430 configured for holding a metal (e.g., solder) ball 460 for course alignment of an IC die 405 having at least one protruding bonding feature shown as plug TSV tip 125 and at least one coarse alignment feature 455 shaped to fit over a metal (e.g., solder) ball 460, according to an embodiment of the invention. Coarse alignment feature 430 is shown in FIG. 4A including a lateral base portion 431 that intimately contacts dielectric layer 144.

As described below, the coarse alignment feature 455 can also be embodied as a group of TSVs that typically includes 3 or 4 TSVs analogous to TSV 120 having TSV tips 125 arranged to bound an inner area that is sized to receive and hold the metal ball 460 referred to herein as a "TSV coarse alignment cluster", wherein the TSV coarse alignment cluster self-centers when dropped over the metal ball 460. The TSV coarse alignment cluster option eliminates the extra processing steps (and associated cost) to achieve formation (i.e. shaping) the non-TSV comprising coarse alignment feature shown in FIG. 4A. In a typical embodiment, IC die 405 has two or more coarse alignment features 455, such a four, with one on each edge of IC die 405, and workpiece 435 includes a matching number of course alignment receptacles 430 aligned with the coarse alignment features 455.

During assembly, one or more (i.e. a wafer) IC die 405 can be moved in plane (x-y) until the coarse alignment feature(s) 455 fit over the metal ball 460 thus providing coarse alignment. Exemplary ways to sense alignment include identifying x,y coordinate of course alignment receptacle(s) 430 optically, and using a drive motor that controls IC die 405 to these coordinates or appropriate offset and drop, using IR optics to look through IC die 405 from above to determine if coarse alignment features 455 are aligned to course alignment receptacle(s) 430, or to look at other optional alignment marks on both IC die 405 and workpiece 435 that when properly aligned are visible with IR from above or below.

FIG. 4B shows some exemplary alignment embodiments for the course alignment receptacle 430 shown in FIG. 4A. Exemplary course alignment receptacle embodiments include course alignment receptacles 471, 472, and 473. Many other course alignment receptacle designs will be apparent to one having ordinary skill in the art.

FIG. 5A shows a top view of workpiece 500 having an array of electrical connectors shown as TSVs with their TSV tips 515 shown by dashed lines (being under metal from RDL 535), and receptacles for protruding bonding features on an IC die shown as sockets 525, wherein respective ones of the TSV tips 515 are coupled to respective ones of the sockets 525 by the RDL 535, according to an embodiment of the invention. The sockets 525 are shown laterally offset from the TSV tips 515. A plurality of different pitches for the RDL 535 are shown. Sockets 525 are shown including optional side tab features 526(a) formed by widening RDL 535 adjacent to the sockets 525 and features 526(b), each of which provides additional adhesion of the sockets 525 to the surface of workpiece 500 and thus enhances reliability. Side tab features 526(a) are not shown placed close to RDL 535 due to minimum feature spacing requirements at RDL pattern, which results in the asymmetric placement pattern including a plurality of attachment angles from the sockets 525 for side tab features 526(a). The side tab features 526(a) may also include different sizes.

FIG. 5B shows a top view of workpiece 550 having array of electrical connectors shown as TSVs with their TSV tips 565 shown by dashed lines (being under metal from RDL 585), and receptacles for protruding bonding features on an IC die shown as sockets 575, wherein respective ones of the TSV tips 565 are coupled to respective ones of the sockets 575 by RDL 585, according to an embodiment of the invention. Workpiece 550 is also shown including course alignment receptacles 473 on its four corners for course alignment with an IC die having coarse alignment features, such as coarse alignment features 455 described above relative to FIG. 4A. The RDL 585 shown all has the same pitch, which as noted above is not a requirement.

Embodiments of the invention can be integrated into a variety of process flows to form a variety of devices and related products. The semiconductor substrates may include various elements therein and/or layers thereon. These can include barrier layers, other dielectric layers, device structures, active elements and passive elements including source regions, drain regions, bit lines, bases, emitters, collectors, conductive lines, conductive vias, etc. Moreover, embodiments of the invention can be used in a variety of processes including bipolar, CMOS, BiCMOS and MEMS.

While various embodiments of the invention have been described above, it should be understood that they have been presented by way of example only, and not limitation. Numerous changes to the disclosed embodiments can be made in accordance with the disclosure herein without departing from the spirit or scope of the disclosed embodiments. Thus, the breadth and scope of embodiments of the invention should not be limited by any of the above explicitly described embodiments. Rather, the scope of the invention should be defined in accordance with the following claims and their equivalents.

Although the embodiments of invention have been illustrated and described with respect to one or more implementations, equivalent alterations and modifications will occur to others skilled in the art upon the reading and understanding of this specification and the annexed drawings. In addition, while a particular feature may have been disclosed with respect to only one of several implementations, such feature may be combined with one or more other features of the other implementations as may be desired and advantageous for any given or particular application.

The terminology used herein is for the purpose of describing particular embodiments only and is not intended to be limiting to embodiments of the invention. As used herein, the singular forms "a," "an," and "the" are intended to include the plural forms as well, unless the context clearly indicates otherwise. Furthermore, to the extent that the terms "including," "includes," "having," "has," "with," or variants thereof are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art to which embodiments of the invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The Abstract of the Disclosure is provided to comply with 37 C.F.R. §1.72(b), requiring an abstract that will allow the reader to quickly ascertain the nature of the technical disclosure. It is submitted with the understanding that it will not be used to interpret or limit the scope or meaning of the following claims.

The invention claimed is:

1. A method for joining (i) at least one integrated circuit (IC) die comprising a substrate including a semiconductor top surface having active circuitry thereon and a bottom surface and at least one protruding bonding feature having sidewall surfaces and a leading edge surface extending from said semiconductor top surface or from said bottom surface to (ii) a workpiece comprising a workpiece surface including at least one framed hollow receptacle and at least one electrical connector, said receptacle coupled to said electrical connector, said receptacle comprising a metal including sidewall portions and a top portion that defines a cavity, wherein said top portion comprises peripheral shelf regions and a gap region between said shelf regions that provides an opening to said cavity, comprising:

pressing said IC die toward said workpiece so that said protruding bonding feature is inserted into said cavity of said receptacle through said opening, said pressing bending said peripheral shelf regions downward into said cavity and towards said sidewall portions of said receptacle to form bent peripheral shelf regions, wherein said protruding bonding feature contacts said bent peripheral shelf regions along a contact area, said contact area being at least primarily along said sidewall surfaces of said protruding bonding feature.

2. The method of claim 1, further comprising forming said receptacle on said workpiece surface.

3. The method of claim 2, wherein said forming said receptacle comprises:
   forming at least one patterned feature on said workpiece surface that comprise a selectively removable material;
   forming a frame comprising metal said around said patterned feature to provide said sidewall portions and a solid top portion that is a precursor to said top portion for said receptacle;
   removing a portion of said metal from said solid top portion to form said top portion of said receptacle including said gap region, and
   selectively removing said selectively removable material while preserving said metal remaining after said removing to define said cavity.

4. The method of claim 1, further comprising forming said workpiece.

5. The method of claim 4, further comprising forming a patterned adhesive layer on said workpiece surface lateral to said top portion of said receptacle, wherein said patterned adhesive layer has a thickness greater than a height of said receptacle for establishing a spacing between said IC die and said workpiece after said pressing.

6. The method of claim 1, further comprising forming said IC die.

7. The method of claim 6, wherein said protruding bonding feature comprises a through substrate vias (TSV) that includes a plug TSV that comprise a plug TSV tip that protrudes from said bottom surface.

8. The method of claim 7, wherein said plug TSV tip includes a dielectric liner and protrudes from said bottom surface a distance of at least 5 µm, wherein a distal contact portion of said plug TSV tip exclusive of said dielectric liner extends a distance of at least 3 µm.

9. The method of claim 8, wherein said plug TSV tip comprises copper and includes at least one metallization layer different from said copper over said distal contact portion.

10. The method of claim 1, wherein an area of said opening <a cross sectional area of said protruding bonding feature <a cross sectional area of said cavity.

11. The method of claim 1, wherein said protruding bonding feature comprises a pillar that protrudes from said semiconductor top surface.

12. The method of claim 1, further comprising forming a solder layer on said protruding bonding feature before said pressing, wherein said solder layer has a maximum thickness ≤5 µm.

13. The method of claim 1, wherein said IC die further comprises at least two coarse alignment features and said workpiece surface comprises at least two alignment receptacles, said alignment receptacles each including a sidewall region and a top region that defines an alignment receptacle cavity, wherein said top region comprises peripheral shelf portion and a gap portion between said shelf portions that provides an opening to said alignment receptacle cavity, further comprising before said pressing:
   dropping a metal ball on said top region of said alignment receptacles, and
   moving said IC die in an in-plane direction until said coarse alignment features are nearly aligned over said metal balls.

14. The method of claim 1, wherein said workpiece comprises a wafer comprising a plurality of workpiece IC die.

15. The method of claim 1, further comprising a thermal connection process after said pressing to form a metallic joint along said contact area between said protruding bonding feature and said receptacle, wherein said thermal connection process is performed at a temperature ≤260° C.

\* \* \* \* \*